(12) United States Patent
Lee et al.

(10) Patent No.: US 10,115,718 B2
(45) Date of Patent: Oct. 30, 2018

(54) METHOD, APPARATUS, AND SYSTEM FOR METAL-OXIDE-SEMICONDUCTOR FIELD-EFFECT TRANSISTOR (MOSFET) WITH ELECTROSTATIC DISCHARGE (ESD) PROTECTION

(71) Applicant: GLOBALFOUNDRIES INC., Grand Cayman (KY)

(72) Inventors: Chien-Hsin Lee, Malta, NY (US); Manjunatha Prabhu, Malta, NY (US); Mahadeva Iyer Natarajan, Clifton Park, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/134,942

(22) Filed: Apr. 21, 2016

(65) Prior Publication Data
US 2017/0309615 A1    Oct. 26, 2017

(51) Int. Cl.
| | |
|---|---|
| H01L 27/02 | (2006.01) |
| H01L 29/417 | (2006.01) |
| H01L 23/535 | (2006.01) |
| H01L 21/768 | (2006.01) |
| G05B 19/4097 | (2006.01) |

(52) U.S. Cl.
CPC ...... *H01L 27/0288* (2013.01); *G05B 19/4097* (2013.01); *H01L 21/76895* (2013.01); *H01L 23/535* (2013.01); *H01L 29/4175* (2013.01); *G05B 2219/45031* (2013.01)

(58) Field of Classification Search
None
See application file for complete search history.

(56) References Cited

U.S. PATENT DOCUMENTS

| | | | |
|---|---|---|---|
| 6,587,320 B1 | 7/2003 | Russ et al. | |
| 2005/0250263 A1* | 11/2005 | Liu | H01L 27/0288 438/151 |
| 2013/0270615 A1* | 10/2013 | Wu | H01L 29/6653 257/288 |

* cited by examiner

*Primary Examiner* — Long Pham
(74) *Attorney, Agent, or Firm* — Williams Morgan, P.C.

(57) ABSTRACT

Methods, apparatus, and systems relating to a MOSFET with ESD resistance, specifically, to a semiconductor device comprising a field-effect transistor (FET) comprising a gate, a source, and a drain, all extending parallel to each other in a first direction; at least one source electrostatic discharge (ESD) protection circuit; a source terminal disposed above and in electrical contact with the at least one source ESD protection circuit, wherein the source terminal extends in the first direction; at least one drain ESD protection circuit; and a drain terminal disposed above and in electrical contact with the at least one drain ESD protection circuit, wherein the drain terminal extends in the first direction.

20 Claims, 8 Drawing Sheets

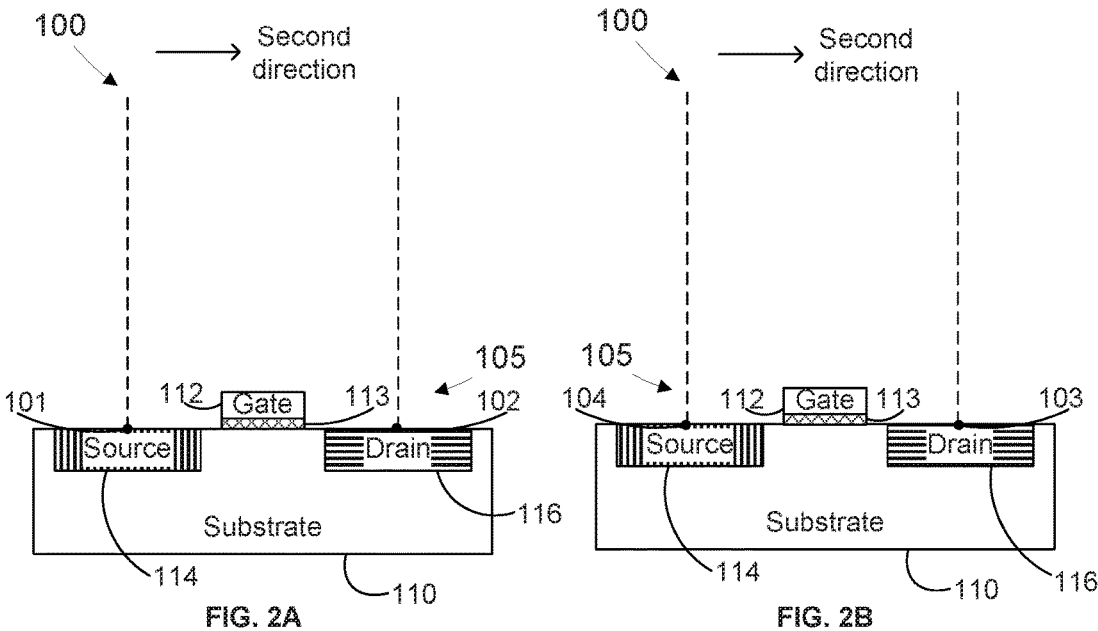
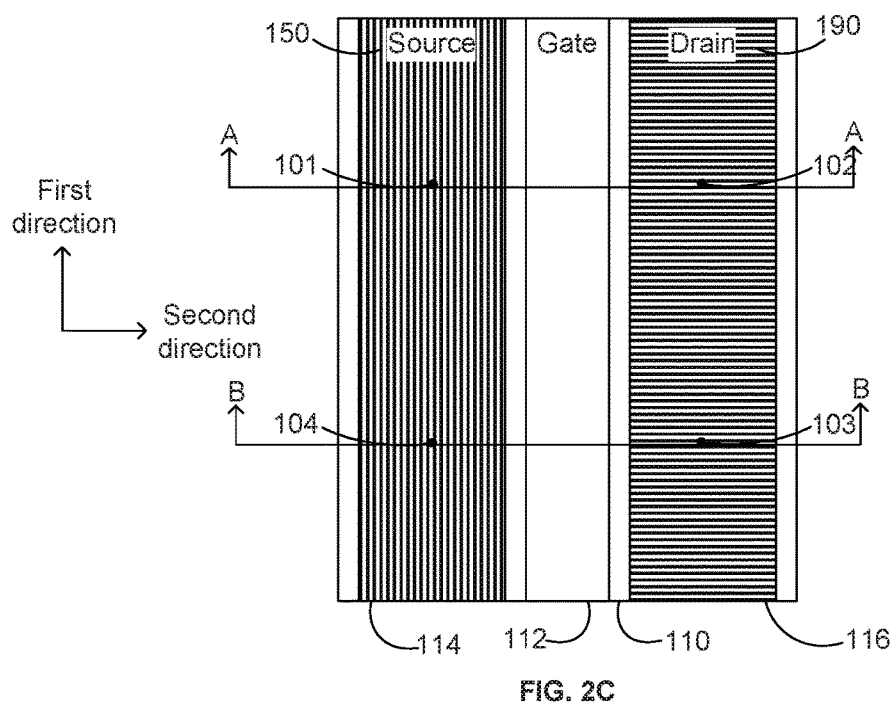

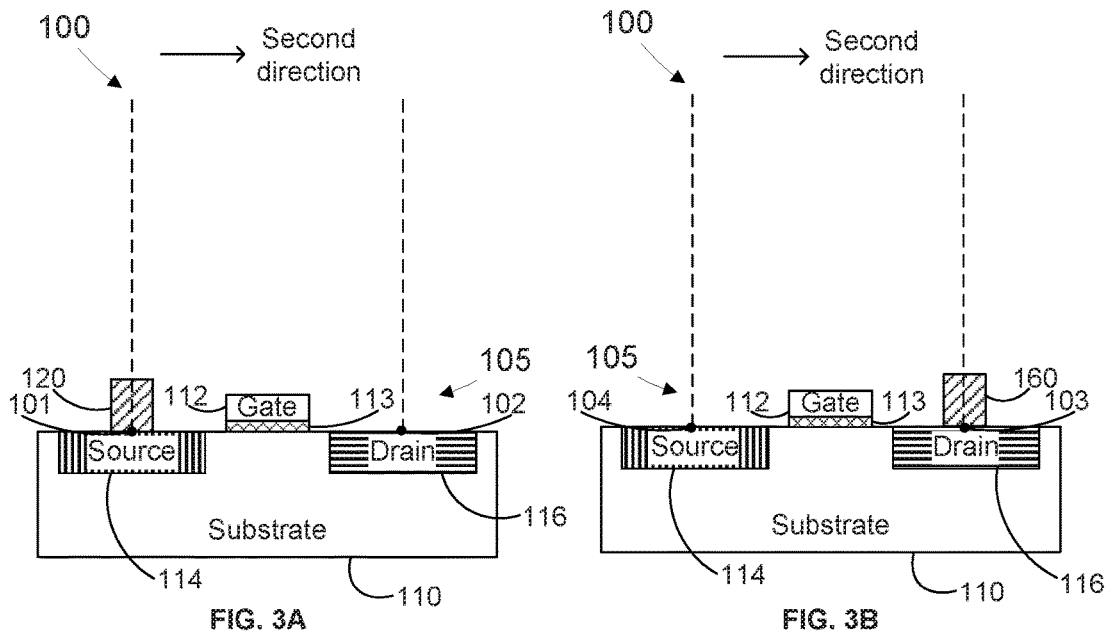
FIG. 3A
FIG. 3B
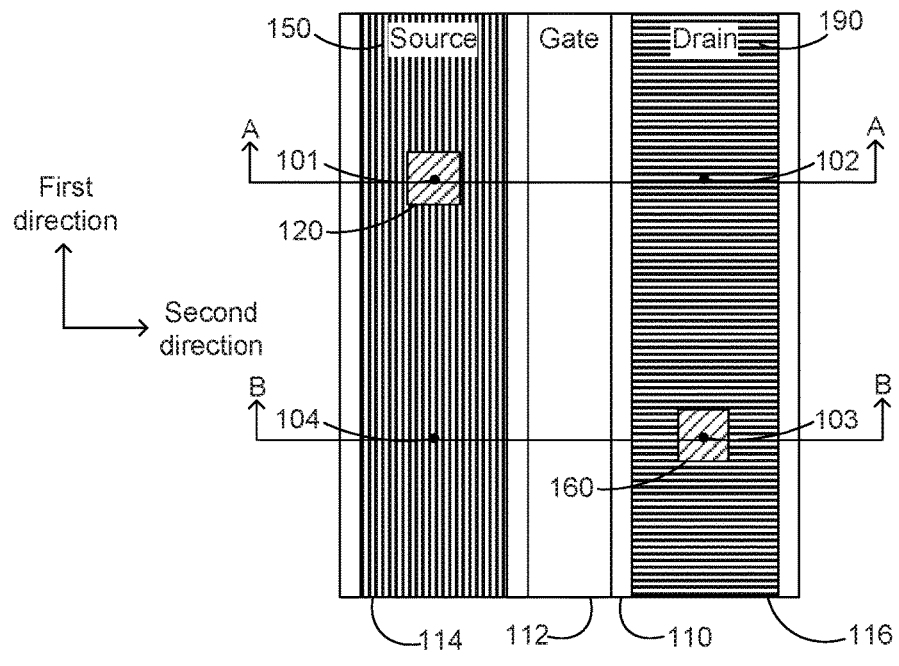
FIG. 3C

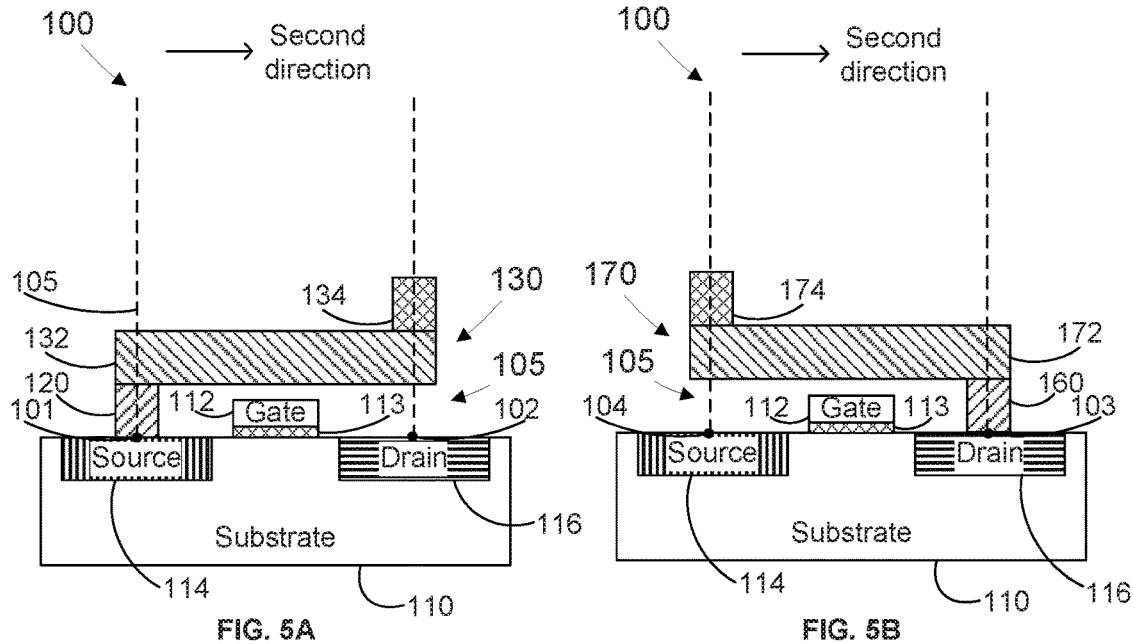
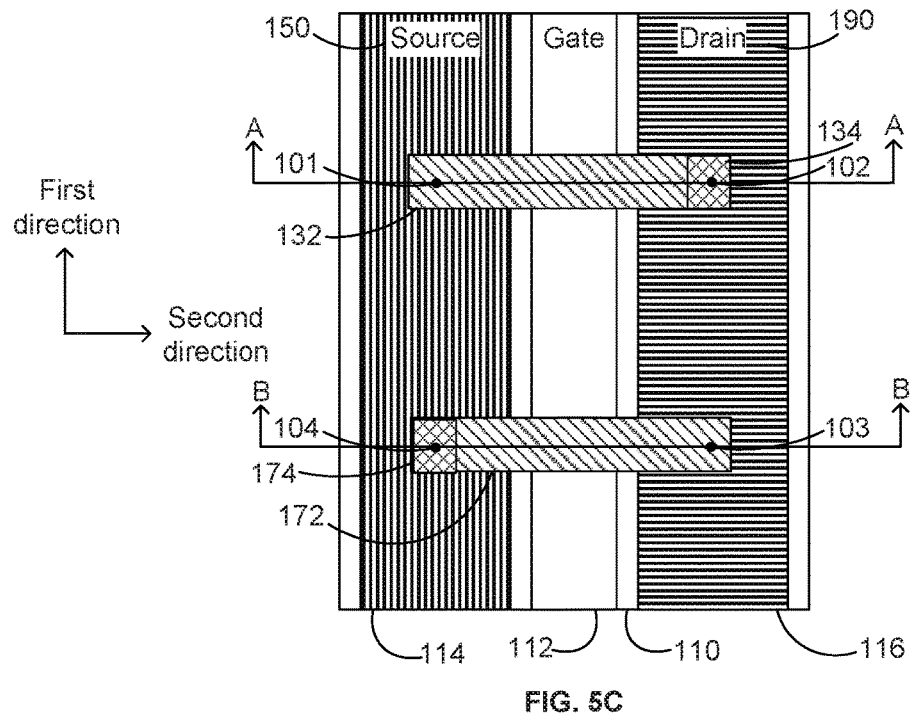

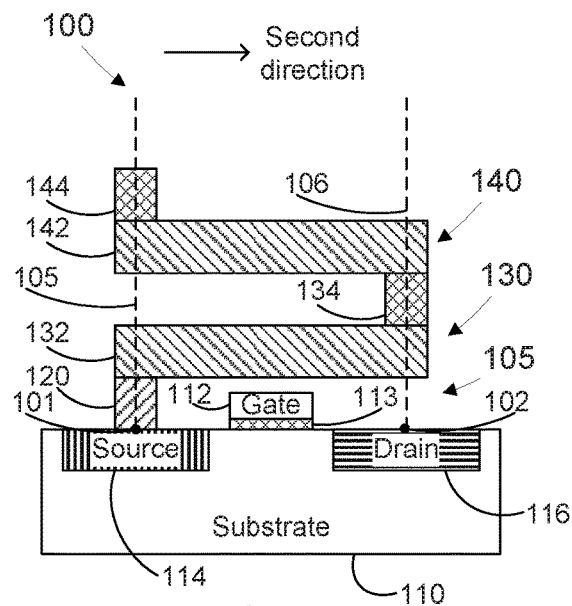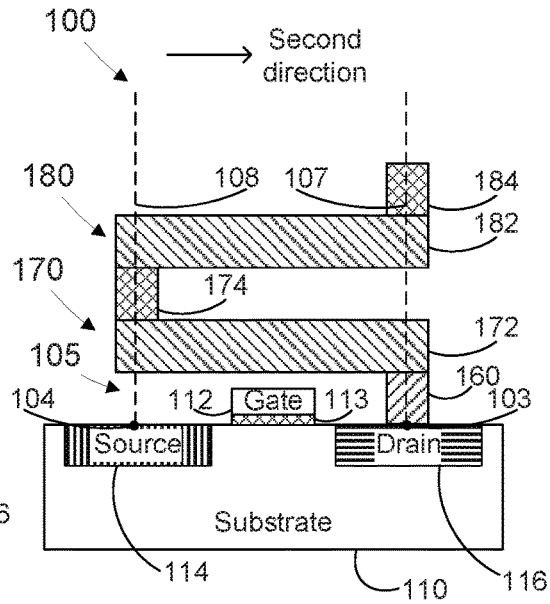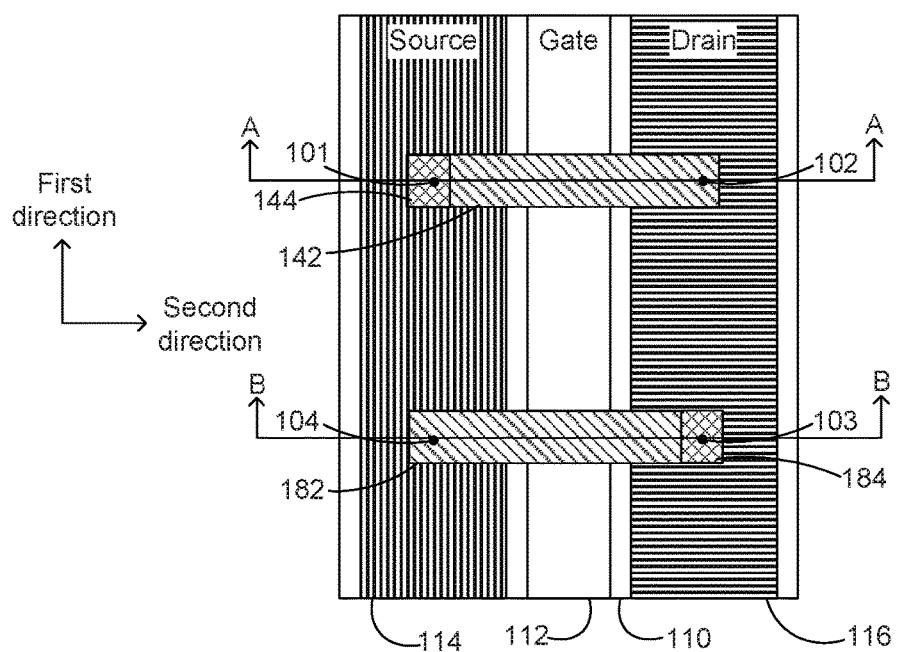

METHOD, APPARATUS, AND SYSTEM FOR METAL-OXIDE-SEMICONDUCTOR FIELD-EFFECT TRANSISTOR (MOSFET) WITH ELECTROSTATIC DISCHARGE (ESD) PROTECTION

BACKGROUND OF THE INVENTION

Field of the Invention

Generally, the present disclosure relates to the manufacture of sophisticated semiconductor devices, and, more specifically, to various methods, structures, and systems relating to a metal-oxide-semiconductor field-effect transistor (MOSFET) with electrostatic discharge (ESD) protection.

Description of the Related Art

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one conductive region on the semiconductor wafer to another. In this manner, integrated circuit chips may be fabricated.

Integrated circuits including metal-oxide-semiconductor field-effect transistors (MOSFETs) receive input signals and transfer output signals in the form of a voltage. These devices are typically made with very small device dimensions in order to maximize the amount of circuitry that can be implemented on the integrated circuit and to allow the circuitry to operate at high frequencies yet with minimal power demands. A problem with these devices, however, is sensitivity to damage from electrical overstresses applied to the input terminals, output terminals, or to internal circuit nodes of the integrated circuit. The gate oxides for these devices are typically very thin and can break down if an applied voltage exceeds even relatively low levels. Such breakdown may cause immediate or expedited destruction of transistors or other devices. Excess voltage is often caused by stress in the form of electrostatic discharge (ESD). In order to combat problems associated with ESD events, it is known to provide protection devices that provide paths through which to rapidly discharge nodes.

However, known protection devices comprise discharge terminals disposed at a lateral distance from a MOSFET. As a result, neighboring MOSFETs must be disposed far enough apart to allow the inclusion of discharge terminals therebetween. The wide separations required for neighboring MOSFETs to use known protection devices reduce the maximum density of MOSFETs in an integrated circuit device. Also, known protection devices are limited in the amount of ESD current they may successfully discharge.

It would therefore be desirable to have protection devices which protect MOSFETs from ESD, especially at higher ESD currents than known in the art, while not reducing the maximum density of MOSFETs in an integrated circuit device.

The present disclosure may address and/or at least reduce one or more of the problems identified above regarding the prior art and/or provide one or more of the desirable features listed above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus, and systems relating to a metal-oxide-semiconductor field-effect transistor (MOSFET) with electrostatic discharge (ESD) protection. In one embodiment, the present disclosure provides a semiconductor device, comprising a semiconductor substrate; a field-effect transistor (FET) comprising a gate disposed on the semiconductor substrate, a source disposed on or in the semiconductor substrate, and a drain disposed on or in the semiconductor substrate, wherein the gate, the source, and the drain extend parallel to each other in a first direction; at least one source electrostatic discharge (ESD) protection circuit; a source terminal disposed above and in electrical contact with the at least one source ESD protection circuit, wherein the source terminal extends in the first direction; at least one drain ESD protection circuit, and a drain terminal disposed above and in electrical contact with the at least one drain ballasting resistor, wherein the drain terminal extends in the first direction.

BRIEF DESCRIPTION OF THE DRAWINGS

The disclosure may be understood by reference to the following description taken in conjunction with the accompanying drawings, in which like reference numerals identify like elements, and in which:

FIG. 2A illustrates a stylized first cross-sectional view of a semiconductor device after a first processing stage in accordance with embodiments herein;

FIG. 2B illustrates a stylized second cross-sectional view of the same semiconductor device as FIG. 2A in accordance with embodiments herein;

FIG. 2C illustrates a stylized plan view of the same semiconductor device as FIG. 2A and FIG. 2B in accordance with embodiments herein;

FIG. 3A illustrates a stylized first cross-sectional view of a semiconductor device after a second processing stage in accordance with embodiments herein;

FIG. 3B illustrates a stylized second cross-sectional view of the same semiconductor device as FIG. 3A in accordance with embodiments herein;

FIG. 3C illustrates a stylized plan view of the same semiconductor device as FIG. 3A and FIG. 3B in accordance with embodiments herein;

FIG. 5A illustrates a stylized first cross-sectional view of a semiconductor device after a fourth processing stage in accordance with embodiments herein;

FIG. 5B illustrates a stylized second cross-sectional view of the same semiconductor device as FIG. 5A in accordance with embodiments herein;

FIG. 5C illustrates a stylized plan view of the same semiconductor device as FIG. 5A and FIG. 5B in accordance with embodiments herein;

FIG. 6A illustrates a stylized first cross-sectional view of a semiconductor device after a fifth processing stage in accordance with embodiments herein;

FIG. 6B illustrates a stylized second cross-sectional view of the same semiconductor device as FIG. 6A in accordance with embodiments herein;

FIG. 6C illustrates a stylized plan view of the same semiconductor device as FIG. 6A and FIG. 6B in accordance with embodiments herein;

Figure 1A:
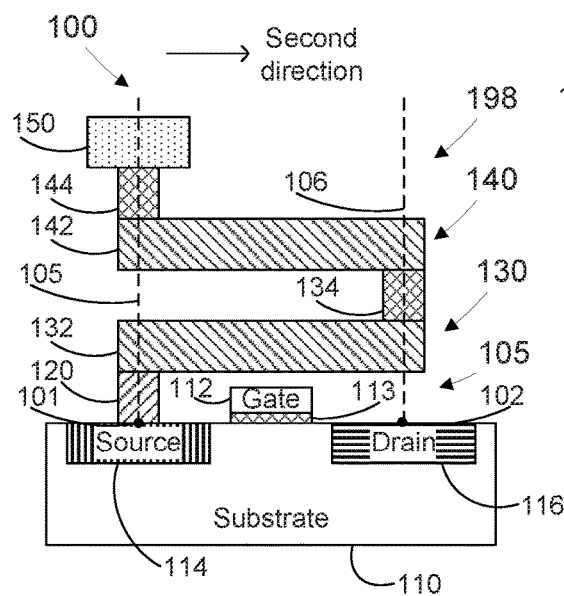
FIG. 1A illustrates a stylized first cross-sectional view of a semiconductor device in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for semiconductor devices comprising MOSFETs and protection devices which protect the MOSFETs from ESD while not reducing the maximum density of MOSFETs in an integrated circuit device.

Figure 1B:
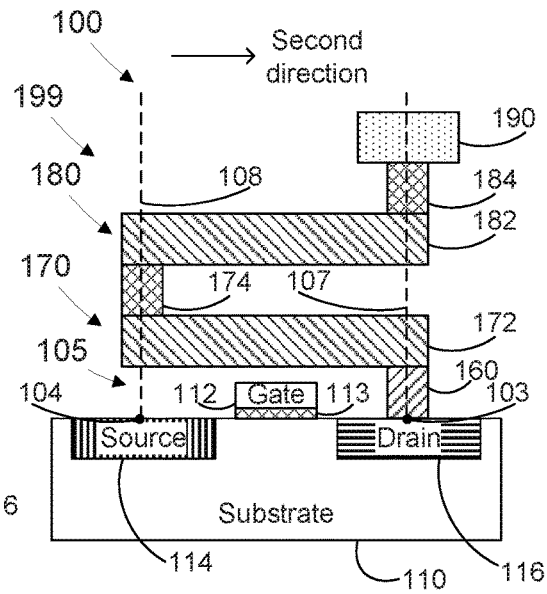
FIG. 1B illustrates a stylized second cross-sectional view of the same semiconductor device as FIG. 1A in accordance with embodiments herein.
Figure 1C:
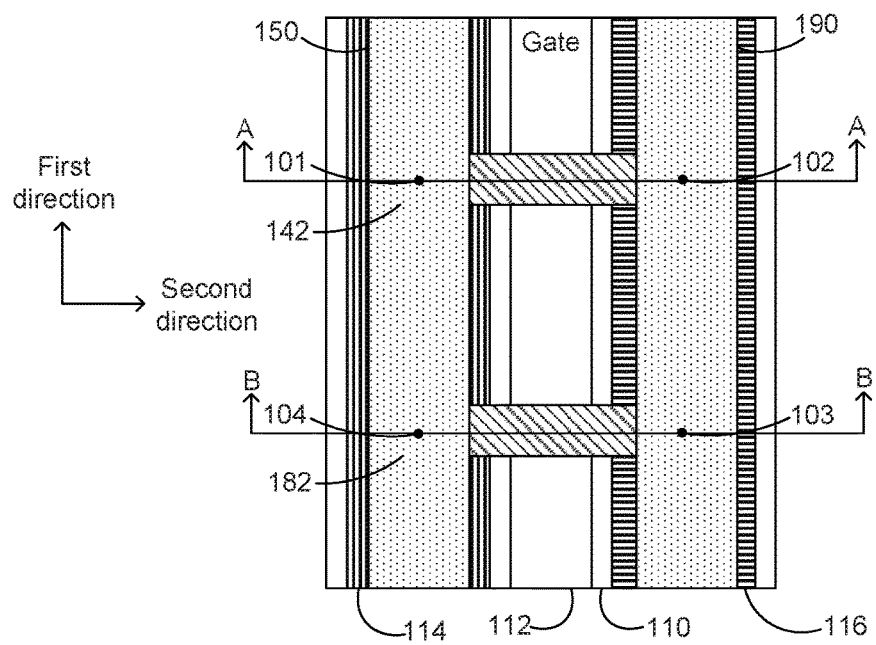
FIG. 1C illustrates a stylized plan view of the same semiconductor device as FIG. 1A and FIG. 1B in accordance with embodiments herein.

Turning now to FIG. 1A, FIG. 1B, and FIG. 1C, we present three views of a semiconductor device 100 in accordance with embodiments herein. FIG. 1A is a first cross-sectional view taken along section A identified in FIG. 1C; FIG. 1B is a second cross-sectional view taken along section B identified in FIG. 1C; and FIG. 1C is a plan view of semiconductor device 100. In deployed embodiments, the depicted components of semiconductor device 100 will generally be surrounded with one or more layers of one or more insulating materials to electrically isolate a circuit from other circuits between which electrical contact is undesirable. For the reader's convenience, all such insulating materials are omitted from the depictions of FIGS. 1A-6C.

The semiconductor device 100 may comprise a semiconductor substrate 110. The semiconductor substrate 110 may comprise any substrate material known or hereafter discovered to be usable in a MOSFET device.

The semiconductor device 100 may comprise a field-effect transistor (FET) 105 comprising a gate 112 disposed on the semiconductor substrate 110. (Between the gate 112 and the substrate 110, the FET 105 also comprises an oxide 113). The FET 105 also comprises a source 114 disposed on or in the semiconductor substrate 110, and a drain 116 disposed on or in the semiconductor substrate 110. The source 114 and the drain 116 of FIGS. 1A-1B are depicted as disposed in the semiconductor substrate 110, but the person of ordinary skill in the art will be aware of other MOSFET designs in which a source and a drain may be disposed above the surface (i.e., disposed on) a semiconductor substrate.

The gate 110, the source 114, and the drain 116 may each comprise any material known or hereafter discovered to be useful in a MOSFET device.

As can be most readily seen in FIG. 1C, the gate 112, the source 114, and the drain 116 may extend (i.e., have a dimension of greatest length) parallel to each other in a first direction.

In one embodiment, at least one of the source 114 and the drain 116 may be silicided. In a further embodiment, both the source 114 and the drain 116 may be silicided.

The semiconductor device 100 may also comprise at least one source electrostatic discharge (ESD) protection circuit 198. The source ESD protection circuit 198 may comprise a source contact 120 disposed on the source 114 at a first location 101. The source contact 120 may comprise any material which has at least some conductivity. In embodiments, the material of the source contact 120 may also have at least some resistivity.

The first location 101 depicted in FIG. 1A and FIG. 1C does not represent a physical structure. The first location 101 is a conceptual descriptor of the location on the source 114 on which the source contact 120 is disposed.

The source ESD protection circuit 198 may also comprise at least one first source ballasting resistor 130. The first source ballasting resistor 130 may comprise a first source conductive element 132 and a first source via 134. The first source conductive element 132 may comprise one or more metals known or hereafter discovered to be highly conductive, such as aluminum or copper. The first source via 134 may comprise one or more metals known or hereafter discovered to be relatively highly resistive, such as tungsten.

In the source ballasting resistor 130, the first source conductive element 132 may extend in a second direction perpendicular to the first direction between a position above the first location 101 and a position above a second location 102, wherein the second location 102 is on the drain 116. The position above the first location 101 may be a position on vertical line 105 and the position above the second location 102 may be a position on vertical line 106.

The vertical line 105 and the vertical line 106 depicted in FIG. 1A do not represent physical structures. The vertical lines 105, 106 are conceptual descriptors of the positions between which the first source conductive element 132 may extend.

As depicted in FIG. 1A, in the source ballasting resistor 130, the first source via 134 may be disposed on the first source conductive element 132 at a position above the second location 102, wherein the first source conductive element 132 is disposed on the contact 120. Given that the at least one source ESD protection circuit 198 may comprise more than one source ballasting resistor, other dispositions of a source via of a source ballasting resistor will be described below.

For example, FIG. 1A depicts an embodiment of semiconductor device 100 wherein the at least one source ESD protection circuit 198 comprises at least two source ballasting resistors 130, 140. In the second source ballasting resistor 140, the second source conductive element 142 may be disposed on the source via of another source ballasting resistor immediately below the source ballasting resistor (e.g., in the embodiment depicted in FIG. 1A, the second source conductive element 142 is disposed on the first source via 134 of first source ballasting resistor 130).

FIG. 1A further depicts the second source via 144 is disposed above the first location 101 (e.g., along vertical line 105) when the source via of another source ballasting resistor immediately below the source ballasting resistor (e.g., the first source via 134 of first source ballasting resistor 130) is disposed above the second location 102. In other embodiments (not shown), a source via may be disposed above the second location 102 when the source via of another source ballasting resistor immediately below the source ballasting resistor is disposed above the first location 101.

In other words, as can be readily seen in and extrapolated from FIG. 1A, the source vias of vertically adjacent source ballasting resistors may be disposed at alternating positions above first location 101 and second location 102. Phrased in another way, all the source ballasting resistors of the at least one source ESD protection circuit 198 may comprise a vertical meander.

The source ESD protection circuit 198 may also comprise a source terminal 150 disposed above the source via of the uppermost source ballasting resistor (e.g., in the embodiment depicted in FIG. 1A, above the second source via 144 of the second source ballasting resistor 140). As depicted in FIG. 1C, in embodiments, the source terminal 150 may extend in the first direction. The source terminal 150 may comprise any conductive material and may be connected to a source of reference potential (e.g., ground).

The semiconductor device 100 may also comprise at least one drain ESD protection circuit 199, such as is depicted in FIG. 1B. The at least one drain ESD protection circuit 199 may comprise a drain contact 160 disposed on the drain 116 at a third location 103. The material comprising the drain contact 160 may be the same as or similar to the material comprising the source contact 120. As can be readily seen in FIG. 1C, the third location 103 and the second location 102 are at different positions in the first direction.

The semiconductor device 100 may also comprise at least a first drain ballasting resistor 170. The first drain ballasting resistor 170 may comprise a first drain conductive element 172 and a first drain via 174, wherein the first drain conductive element 172 extends in the second direction between a position above the third location 103 (e.g., along vertical line 107) and a position above a fourth location 104 (e.g., along vertical line 108), wherein the fourth location 104 is on the source 114. As can be readily seen in FIG. 1C, the first location 101 and the fourth location 104 are at different positions in the first direction.

The vertical line 107 and the vertical line 108 depicted in FIG. 1B do not represent physical structures. The vertical lines 107, 108 are conceptual descriptors of the positions between which the first drain conductive element 172 may extend.

The first drain via 174 may be disposed on the first drain conductive element 172 at a position above the fourth location 104, e.g., on vertical line 108.

The first drain conductive element 172 may comprise the same or similar material as the first source conductive element 132, and the first drain via 174 may comprise the same or similar material as the first source via 134.

As depicted in FIG. 1B, the drain ESD protection circuit 199 may comprise a second drain ballasting resistor 180, comprising a second drain conductive element 182 disposed on the drain via of another drain ballasting resistor immediately below the drain ballasting resistor (e.g., as depicted, the second drain conductive element 182 may be disposed on the first drain via 174 of the first drain ballasting resistor 170), and a second drain via 184 disposed above the third location when the first drain via of another drain ballasting resistor immediately below the drain ballasting resistor is disposed above the fourth location (e.g., as depicted, the second drain via 184 may be disposed on the second drain conductive element 182 above the third location). In other embodiments (not shown), wherein the drain ESD protection circuit 199 may comprise more than two drain ballasting resistors, the drain vias of subsequent ballasting resistors may be disposed above the fourth location when the drain via of another drain ballasting resistor immediately below the drain ballasting resistor in question is disposed above the third location.

In other words, as can be readily seen in and extrapolated from FIG. 1B, the drain vias of vertically adjacent drain ballasting resistors may be disposed at alternating positions above third location 103 and fourth location 104. Phrased another way, all the drain ballasting resistors of the at least one drain ESD protection circuit may comprise a vertical meander.

The drain ESD protection circuit 199 may comprise a drain terminal 190 disposed above the drain via of the uppermost drain ballasting resistor (e.g., as depicted in FIG. 1B, above second drain via 184 of second drain ballasting resistor 180). The drain terminal 190 may extend in the first direction, as depicted in FIG. 1C.

As should be apparent to the person of ordinary skill in the art having the benefit of the present disclosure, although two source ballasting resistors 140, 150 are depicted in FIG. 1A, the source ESD protection circuit 198 may comprise any number of source ballasting resistors, such as one, two, three, four, or more. Likewise, although two drain ballasting resistors 170, 180 are depicted in FIG. 1B, the drain ESD protection circuit 199 may comprise any number of drain ballasting resistors, such as one, two, three, four, or more.

Further, as should be apparent to the person of ordinary skill in the art having the benefit of the present disclosure, the semiconductor device 100 may comprise more than one source ESD protection circuit 198, such as at least two source ESD protection circuits, such as three, four, or more. Likewise, the semiconductor device 100 may comprise more than one ESD protection circuit 199, such as at least two drain ESD protection circuits, such as three, four, or more. In embodiments wherein the semiconductor device 100 comprises two or more source ESD protection circuits, such circuits may be disposed to be electrically isolated from one another and from all drain ESD protection circuits (i.e., the first and second locations in each source ESD protection circuit are unique among all source ESD protection circuits and are not the fourth or third locations of any drain ESD protection circuit). In embodiments wherein the semiconductor device 100 comprises two or more drain ESD protection circuits, such circuits may be disposed to be electrically isolated from one another and from all source ESD protection circuits. The number of source ESD protection circuits, drain ESD protection circuits, source ballasting resistors per source ESD protection circuit, and drain ballasting resistors per drain ESD protection circuit, may be routinely chosen by the person of ordinary skill in the art having the benefit of the present disclosure.

Turning now to FIGS. 2A-2C, we present three views of a semiconductor device 100 after a first processing stage in accordance with embodiments herein. FIG. 2A is a first cross-sectional view taken along the same section as FIG. 1A; FIG. 2B is a second cross-sectional view taken along the same section as FIG. 1B; and FIG. 2C is a plan view of semiconductor device 100.

The semiconductor device 100 of FIGS. 2A-2C is depicted after a first processing stage. The first processing stage may comprise forming a field-effect transistor (FET) 105 comprising a gate 112 disposed on a semiconductor substrate 110 (such as the depicted gate 112 disposed on an oxide 113 disposed on the semiconductor substrate 110), a source 114 disposed on or in the semiconductor substrate 110, and a drain 116 disposed on or in the semiconductor substrate 100, wherein the gate 112, the source 114, and the drain 116 extend parallel to each other in a first direction.

FIGS. 3A-3C present the same three views of the semiconductor device 100, after a second processing stage. The second processing stage may comprise forming a source contact 120 on the source 110 at a first location 101, and a drain contact 160 on the drain 116 at a third location 103.

The source contact 120 and/or the drain contact 160 may be formed using any appropriate technique known to the person of ordinary skill in the art having the benefit of the present disclosure. Although not shown, forming the source contact 120 and the drain contact 160 may further comprise forming one or more regions of an insulating material in contact with the sides of the source contact 120 and the drain contact 160.

Figures 4A, 4B:
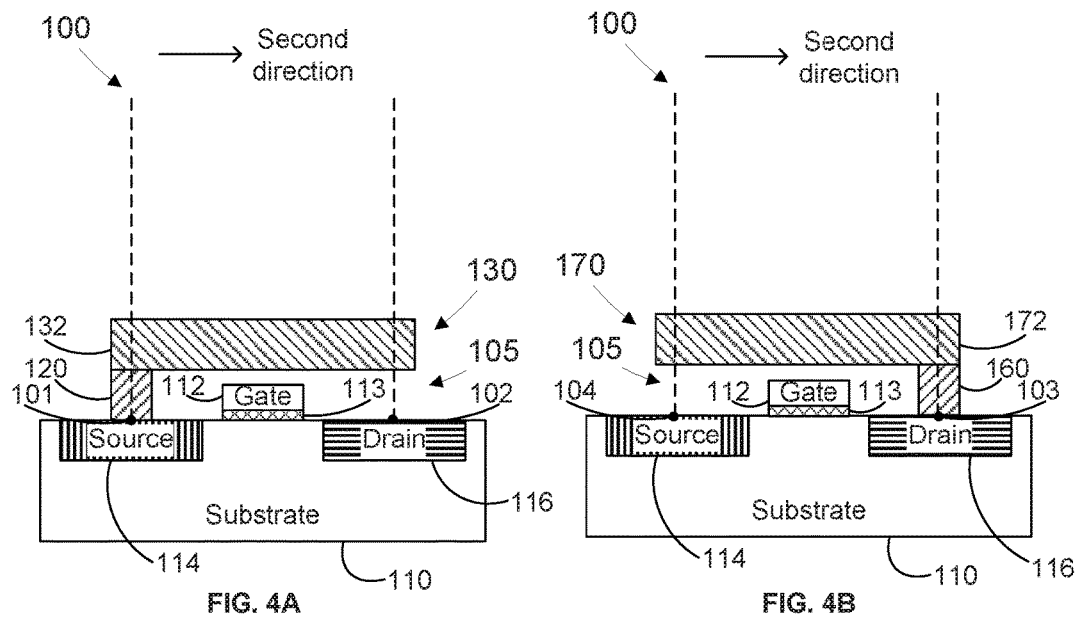
FIG. 4A illustrates a stylized first cross-sectional view of a semiconductor device after a third processing stage in accordance with embodiments herein.
FIG. 4B illustrates a stylized second cross-sectional view of the same semiconductor device as FIG. 4A in accordance with embodiments herein.
Figure 4C:
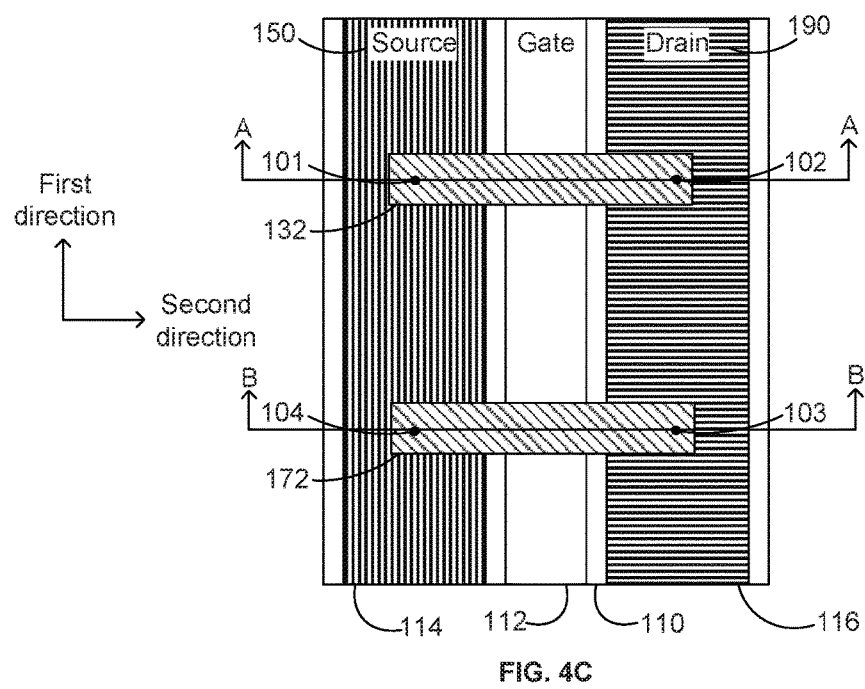
FIG. 4C illustrates a stylized plan view of the same semiconductor device as FIG. 4A and FIG. 4B in accordance with embodiments herein.

Moving on, FIGS. 4A-4C present the same three views of the semiconductor device 100, after a third processing stage. The third processing stage may comprise forming a first source conductive element 132 on the source contact 120. As depicted, the first source conductive element 132 may extend in a second direction perpendicular to the first direction between a position above the first location 101 and a position above a second location 102, wherein the second location 102 is on the drain 116 at a position displaced in the first direction from the third location 103. Alternatively or in addition, the third processing stage may comprise forming a first drain conductive element 172 on the drain contact 160. As shown, the first drain conductive element 172 may extend in the second direction between a position above the third location 103 and a position above a fourth location 104, wherein the fourth location 104 is on the source 114 at a position displaced in the first direction from the first location. The first source conductive element 132 and the first drain conductive element 172 may be formed using any appropriate technique known to the person of ordinary skill in the art having the benefit of the present disclosure. Although not shown, forming the first source conductive element 132 and the first drain conductive element 172 may further comprise forming one or more regions of an insulating material in contact with the sides of each conductive element 132, 172.

Next, FIGS. 5A-5C present the same three views of the semiconductor device 100, after a fourth processing stage. The fourth processing stage may comprise forming a first source via 134 on the first source conductive element 132 at the position above the second location 102, and forming a first drain via 174 on the first drain conductive element 172 at the position above the fourth location 104. The first source via 134 and the first drain via 174 may be formed using any appropriate technique known to the person of ordinary skill in the art having the benefit of the present disclosure. Similarly to the second and third processing stages, forming the first source via 134 and the first drain via 174 may further comprise forming one or more regions of an insulating material in contact with the sides of each via 134, 174.

FIGS. 6A-6C present the same three views of the semiconductor device 100, after a fifth processing stage. The fifth processing stage may comprise forming a second source conductive element 142 on the first source via 134, wherein the second source conductive element 142 extends in the second direction between a position above the first location 101 and a position above the second location 102. Alternatively or in addition, the fifth processing stage may comprise forming a second drain conductive element 182 on the first drain via 174, wherein the second drain conductive element 182 extends in the second direction between the position above the third location 103 and the position above the fourth location 104.

The fifth processing stage may also comprise one or both of forming a second source via 144 on the second source conductive element 142 at the position above the first location 101, and a second drain via 184 on the second drain conductive element 182 at the position above the third location.

The second source conductive element 142, the second source via 144, the second drain conductive element 182, and the second drain via 184 may be formed using any appropriate technique known to the person of ordinary skill in the art having the benefit of the present disclosure. Similarly, to the second and third processing stages, forming the various components 142, 144, 182, and 184 may further comprise forming one or more regions of an insulating material in contact with the sides of each of components 142, 144, 182, and 184.

The semiconductor device 100 may be subjected to a sixth processing stage, which may yield the semiconductor device 100 depicted in FIGS. 1A-1C and discussed above. The sixth processing stage may comprise forming a source terminal 150 above and in electrical contact with the first source via 134 (e.g., in electrical contact by way of a conductive path comprising the second source conductive element 142 and the second source via 144) and/or forming a drain terminal 190 above and in electrical contact with the first drain via 174 (e.g., in electrical contact by way of a conductive path comprising the second drain conductive element 182 and the second drain via 184). In one embodiment, the source terminal 150 and the drain terminal 190 may extend in the first direction.

Figure 7:
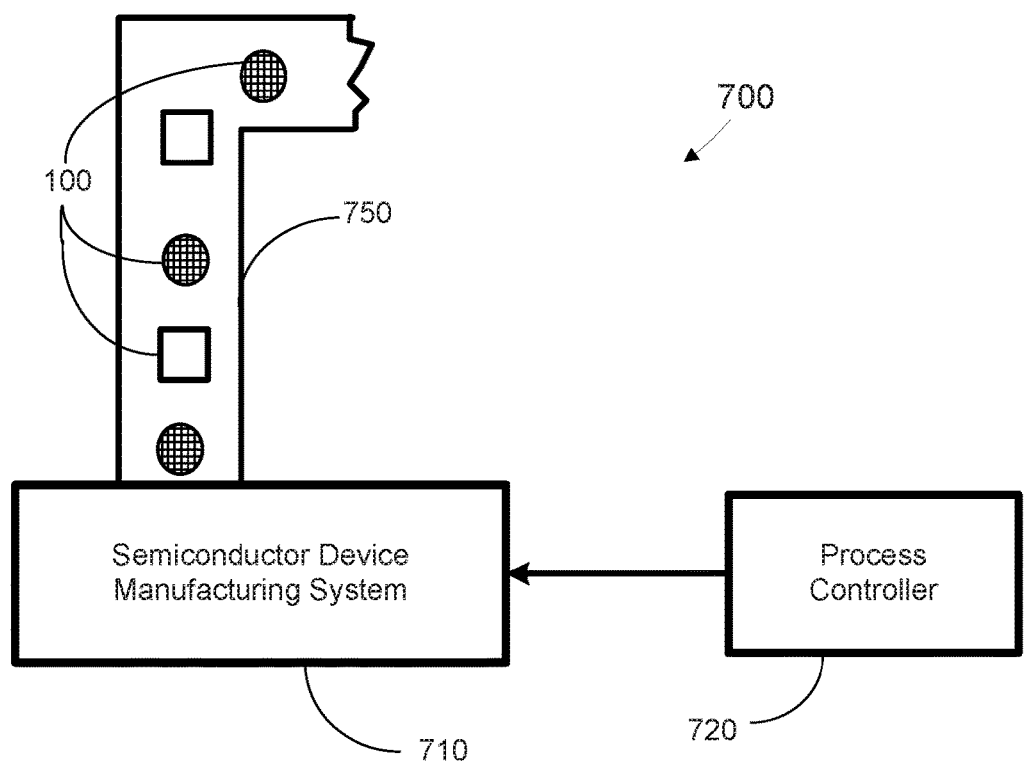
FIG. 7 illustrates a semiconductor device manufacturing system for manufacturing a device in accordance with embodiments herein.

Turning now to FIG. 7, a stylized depiction of a system for fabricating a semiconductor device 100, in accordance with embodiments herein, is illustrated. The system 700 of FIG. 7 may comprise a semiconductor device manufacturing system 710 and a process controller 720. The semiconductor device manufacturing system 710 may manufacture semiconductor devices based upon one or more instruction sets provided by the process controller 720.

In one embodiment, the instruction set may comprise instructions to form a field-effect transistor (FET) comprising a gate disposed on a semiconductor substrate, a source disposed on or in the semiconductor substrate, and a drain disposed on or in the semiconductor substrate, wherein the gate, the source, and the drain extend parallel to each other in a first direction; form a source contact on the source at a first location and a drain contact on the drain at a third location; form a first source conductive element on the source contact, wherein the first source conductive element extends in a second direction perpendicular to the first direction between a position above the first location and a position above a second location, wherein the second location is on the drain at a position displaced in the first direction from the third location; form a first drain conductive element on the drain contact, wherein the first drain conductive element extends in the second direction between a position above the third location and a position above a fourth location, wherein the fourth location is on the source at a position displaced in the first direction from the first location; form a first source via on the first source conductive element at the position above the second location and a first drain via on the first drain conductive element at the position above the fourth location; and form a source terminal above and in electrical contact with the first source via and a drain terminal above and in electrical contact with the first drain via, wherein the source terminal and the drain terminal extend in the first direction.

The semiconductor device manufacturing system 710 may comprise various processing stations, such as etch process stations, photolithography process stations, CMP process stations, etc. One or more of the processing steps performed by the semiconductor device manufacturing system 710 may be controlled by the process controller 720. The process controller 720 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device manufacturing system 710 may produce semiconductor devices 100 (e.g., integrated circuits comprising the MOSFET and ESD protection circuits described above) on a medium, such as silicon wafers. The semiconductor device manufacturing system 710 may provide processed semiconductor devices 100 on a transport mechanism 750, such as a conveyor system. In some embodiments, the conveyor system may be sophisticated clean room transport systems that are capable of transporting semiconductor wafers. In one embodiment, the semiconductor device manufacturing system 710 may comprise a plurality of processing steps, e.g., the $1^{st}$ process step, the $2^{nd}$ process step, etc.

In some embodiments, the items labeled "100" may represent individual wafers, and in other embodiments, the items 100 may represent a group of semiconductor wafers, e.g., a "lot" of semiconductor wafers. The semiconductor device 100 may comprise one or more of a transistor, a capacitor, a resistor, a memory cell, a processor, and/or the like.

The system 700 may be capable of manufacturing various products involving various technologies. For example, the system 700 may produce devices of CMOS technology, Flash technology, BiCMOS technology, power devices, memory devices (e.g., DRAM devices), NAND memory devices, and/or various other semiconductor technologies.

Figure 8:
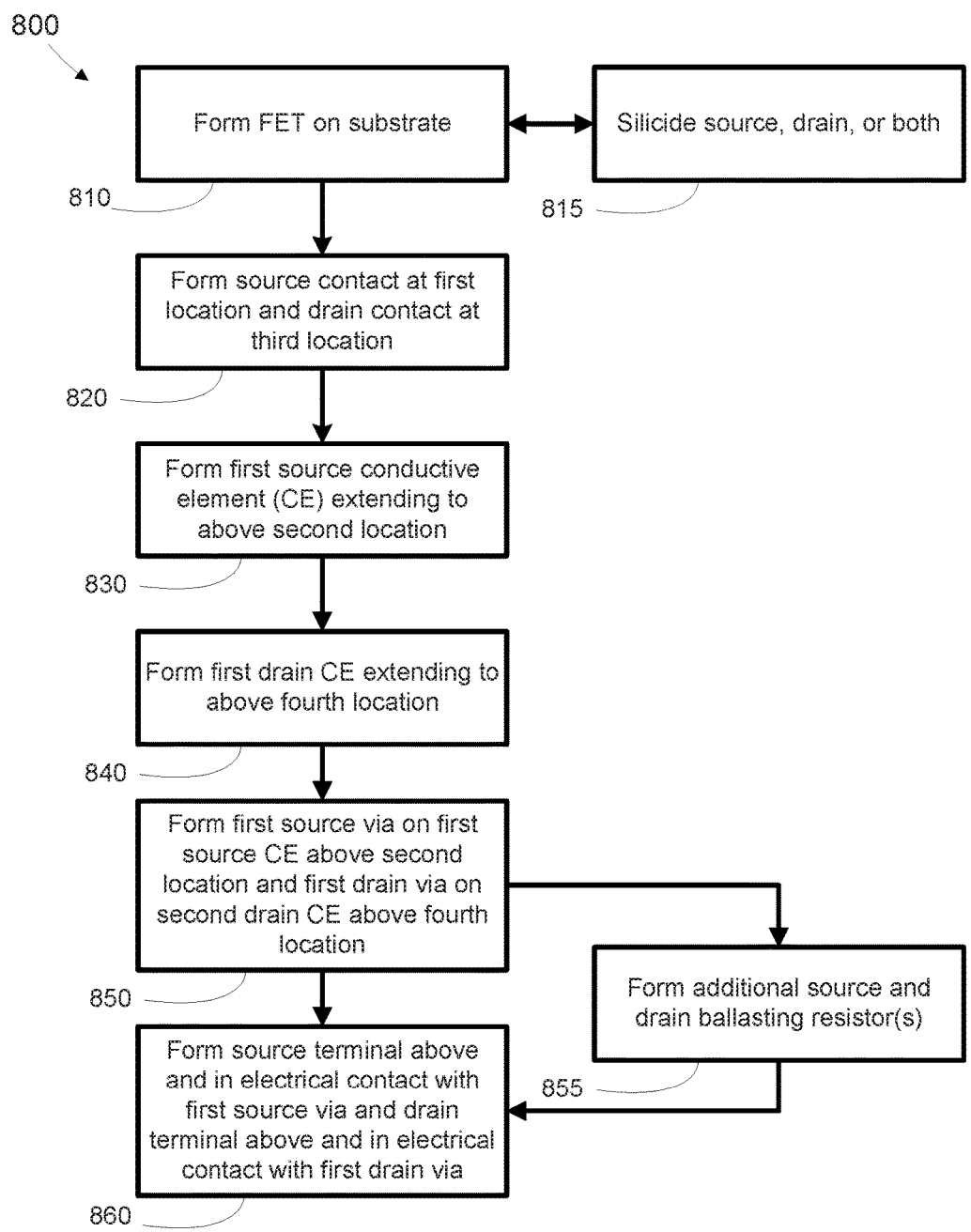
FIG. 8 illustrates a flowchart of a method in accordance with embodiments herein.

Turning to FIG. 8, a flowchart of a method 800 in accordance with embodiments herein is depicted. The method 800 may comprise forming (at 810) a field-effect transistor (FET) comprising a gate disposed on a semiconductor substrate, a source disposed on or in the semiconductor substrate, and a drain disposed on or in the semiconductor substrate, wherein the gate, the source, and the drain extend parallel to each other in a first direction.

In one embodiment, the method 800 may also comprise at least one of siliciding (at 815) the source or the drain. In a particular embodiment, the siliciding (at 815) may comprise both siliciding the source and siliciding the drain.

The method 800 may involve forming source and drain ESD protection circuits. In one embodiment, the method 800 may also comprise forming (at 820) a source contact on the source at a first location and a drain contact on the drain at a third location.

The method 800 may also involve forming at least a first source ballasting resistor and at least a first drain ballasting resistor. In one embodiment, the method 800 may also comprise forming (at 830) a first source conductive element on the source contact, wherein the first source conductive element extends in a second direction perpendicular to the first direction between a position above the first location and a position above a second location, wherein the second location is on the drain at a position displaced in the first direction from the third location; forming (at 840) a first drain conductive element on the drain contact, wherein the first drain conductive element extends in the second direction between a position above the third location and a position above a fourth location, wherein the fourth location is on the source at a position displaced in the first direction from the first location; and forming (at 850) a first source via on the first source conductive element at the position above the second location and a first drain via on the first drain conductive element at the position above the fourth location.

The method 800 may also involve forming (at 855) one or more additional source and drain ballasting resistors. In one embodiment, forming (at 855) one or more additional source and drain ballasting resistors may comprise forming a second source conductive element on the first source via, wherein the second source conductive element extends in the second direction between a position above the first location and a position above the second location; forming a second drain conductive element on the first drain via, wherein the second drain conductive element extends in the second direction between the position above the third location and the position above the fourth location; and forming a second source via on the second source conductive element at the position above the first location and a second drain via on the second drain conductive element at the position above the third location.

Regardless whether additional source and drain ballasting resistors may be formed (at 855), the method 800 may comprise forming (at 860) a source terminal above and in electrical contact with the first source via and a drain terminal above and in electrical contact with the first drain via, wherein the source terminal and the drain terminal extend in the first direction. If at least one additional source and drain ballasting resistor are formed (at 855), then forming (at 860) may comprise forming the source terminal above and in electrical contact with the second source via and the forming the drain terminal above and in electrical contact with the second drain via.

The methods described above may be governed by instructions that are stored in a non-transitory computer readable storage medium and that are executed by, e.g., a processor in a computing device. Each of the operations described herein (e.g., FIG. 7) may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
a semiconductor substrate;
a field-effect transistor (FET) comprising a gate disposed on the semiconductor substrate, a source disposed on or in the semiconductor substrate, and a drain disposed on or in the semiconductor substrate, wherein the gate, the source, and the drain extend parallel to each other in a first horizontal direction;
at least one source electrostatic discharge (ESD) protection circuit comprising a source contact disposed on the source at a first location, and a first source ballasting resistor, wherein said source ballasting resistor comprises a first source conductive element disposed on the source contact and extending in a second horizontal direction perpendicular to the first horizontal direction between a position above the first location and a position above a second location, wherein the second location is on the drain;
a source terminal disposed above and in electrical contact with the first source ballasting resistor, wherein the source terminal extends in the first direction;
at least one drain ESD protection circuit comprising a first drain ballasting resistor; and
a drain terminal disposed above and in electrical contact with the first drain ballasting resistor, wherein the drain terminal extends in the first horizontal direction.

2. The semiconductor device of claim 1,
wherein the first source ballasting resistor further comprises a first source via disposed on the first source conductive element at a position above the second location; and
wherein the at least one drain ESD protection circuit comprises:
a drain contact disposed on the drain at a third location, wherein the third location and the second location are at different positions in the first direction;
wherein the first drain ballasting resistor comprises a first drain conductive element and a first drain via, wherein the first drain conductive element is disposed on the drain contact and extends in the second direction between a position above the third location and a position above a fourth location, wherein the fourth location is on the source and the first location and the fourth location are at different positions in the first direction, and the first drain via is disposed on the first drain conductive element at a position above the fourth location.

3. The semiconductor device of claim 2, wherein the at least one source ESD protection circuit comprises at least one additional source ballasting resistor disposed vertically above the first source ballasting resistor, wherein all the source ballasting resistors of the source ESD protection circuit comprise a vertical meander; and
the at least one drain ESD protection circuit comprises at least one additional drain ballasting resistor disposed vertically above the first drain ballasting resistor, wherein all the drain ballasting resistors of the drain ESD protection circuit comprise a vertical meander.

4. The semiconductor device of claim 3, wherein the at least one source ESD protection circuit comprises at least three source ballasting resistors, and the at least one drain ESD protection circuit comprises at least three drain ballasting resistors.

5. The semiconductor device of claim 1, wherein the semiconductor device comprises at least two source ESD protection circuits and at least two drain ESD protection circuits.

6. The semiconductor device of claim 1, wherein at least one of the source and the drain comprises silicide.

7. A method, comprising:
forming a field-effect transistor (FET) comprising a gate disposed on a semiconductor substrate, a source disposed on or in the semiconductor substrate, and a drain disposed on or in the semiconductor substrate, wherein the gate, the source, and the drain extend parallel to each other in a first horizontal direction;

forming a source contact on the source at a first location and a drain contact on the drain at a second location;

forming at least one source electrostatic discharge (ESD) protection circuit, comprising forming a first source ballasting resistor comprising a first source conductive element disposed on the source contact and extending in a second direction perpendicular to the first direction between a position above the first location and a position above a third location, wherein the third location is on the drain;

forming at least one drain ESD protection circuit; and forming a source terminal above and in electrical contact with the at least one source ESD protection circuit and a drain terminal above and in electrical contact with the at least one drain ESD protection circuit, wherein the source terminal and the drain terminal extend in the first direction.

8. The method of claim 7, wherein forming the at least one source ESD protection circuit comprises forming a first source via on the first source conductive element at a position above the third location, wherein the third location and the second location are at different positions in the first direction; and forming the at least one drain ESD protection circuit comprises forming a first drain ballasting resistor comprising a first drain conductive element and a first drain via, wherein the first drain conductive element is disposed on the drain contact and extends in the second direction between a position above the second location and a position above a fourth location, wherein the fourth location is on the source and the first location and the fourth location are at different positions in the first direction, and the first drain via is disposed on the first drain conductive element at a position above the fourth location.

9. The method of claim 7, wherein forming the FET comprises at least one of siliciding the source or siliciding the drain.

10. The method of claim 9, wherein forming the FET comprises both siliciding the source and siliciding the drain.

11. A system, comprising:

a process controller, configured to provide an instruction set for manufacture of a semiconductor device to a manufacturing system; and the manufacturing system, configured to manufacture the semiconductor device according to the instruction set;

wherein the instruction set comprises instructions to:

form a field-effect transistor (FET) comprising a gate disposed on a semiconductor substrate, a source disposed on or in the semiconductor substrate, and a drain disposed on or in the semiconductor substrate, wherein the gate, the source, and the drain extend parallel to each other in a first horizontal direction;

form a source contact on the source at a first location and a drain contact on the drain at a second location;

form at least one source electrostatic discharge (ESD) protection circuit comprising a first source ballasting resistor, wherein said source ballasting resistor comprises a first source conductive element disposed on the source contact and extending in a second horizontal direction perpendicular to the first horizontal direction between a position above the first location and a position above a third location, wherein the third location is on the drain;

form at least one drain ESD protection circuit; and form a source terminal above and in electrical contact with the at least one source ESD protection circuit and a drain terminal above and in electrical contact with the at least one drain ESD protection circuit, wherein the source terminal and the drain terminal extend in the first horizontal direction.

12. The system of claim 11, wherein the instructions to form the at least one source ESD protection circuit comprise instructions to form a first source via on the first source conductive element at a position above the third location, wherein the third location and the second location are at different positions in the first direction; and wherein the instructions to form the at least one drain ESD protection circuit comprise instructions to form a first drain ballasting resistor comprising a first drain conductive element and a first drain via, wherein the first drain conductive element is disposed on the drain contact and extends in the second direction between a position above the second location and a position above a fourth location, wherein the fourth location is on the source and the first location and the fourth location are at different positions in the first direction, and the first drain via is disposed on the first drain conductive element at a position above the fourth location.

13. The system of claim 11, wherein the instructions to form the FET comprise instructions to silicide the source, silicide the drain, or silicide both the source and the drain.

14. The system of claim 13, wherein the instructions to form the FET comprise instructions to silicide both the source and the drain.

15. The system of 11, wherein the semiconductor device comprises:

a semiconductor substrate;

a field-effect transistor (FET) comprising a gate disposed on the semiconductor substrate, a source disposed on or in the semiconductor substrate, and a drain disposed on or in the semiconductor substrate, wherein the gate, the source, and the drain extend parallel to each other in a first direction;

at least one source electrostatic discharge (ESD) protection circuit;

a source terminal disposed above an in electrical contact with the first source ballasting resistor, wherein the source terminal extends in the first direction;

at least one drain ESD protection circuit; and a drain terminal disposed above and in electrical contact with the first drain ballasting resistor, wherein the drain terminal extends in the first direction.

16. The system of claim 15, wherein the at least one source ESD protection circuit comprises:

a source contact disposed on the source at a first location; and a first source via, wherein the first source conductive element is disposed on the source contact and extends in the second direction between a position above the first location and a position above a second location, wherein the second location is on the drain, and the first source via is disposed on the first source conductive element at a position above the second location; and wherein the at least one drain ESD protection circuit comprises:

a drain contact disposed on the drain at a third location, wherein the third location and the second location are at different positions in the first direction; and a first drain ballasting resistor comprising a first drain conductive element and a first drain via, wherein the first drain conductive element is disposed on the drain contact and extends in the second direction between a position above the third location and a position above a fourth location, wherein the fourth location is on the source and the first location and the fourth location are at different positions in the first direction, and the first drain via is disposed on the first drain conductive element at a position above the fourth location.

17. The system of claim 15, wherein the at least one source ESD protection circuit comprises at least one additional source ballasting resistor disposed vertically above the first source ballasting resistor, wherein all the source ballasting resistors of the source ESD protection circuit comprise a vertical meander; and the at least one drain ESD protection circuit comprises at least one additional drain ballasting resistor disposed vertically above the first drain ballasting resistor, wherein all the drain ballasting resistors of the drain ESD protection circuit comprise a vertical meander.

18. The system of claim 17, wherein the at least one source ESD protection circuit comprises at least three source ballasting resistors, and the at least one drain ESD protection circuit comprises at least three drain ballasting resistors.

19. The system of claim 15, wherein the semiconductor device comprises at least two source ESD protection circuits, and the at least one drain ESD protection circuit comprises at least two drain ESD protection circuits.

20. The system of claim 15, wherein at least one of the source and the drain comprises silicide.

* * * * *